United States Patent
Gilderdale

[11] Patent Number: 5,879,300
[45] Date of Patent: Mar. 9, 1999

[54] MAGNETIC RESONANCE METHODS AND APPARATUS

[75] Inventor: David John Gilderdale, Newton Abbot, United Kingdom

[73] Assignee: Picker International, Inc., Cleveland, Ohio

[21] Appl. No.: 674,676

[22] Filed: Jul. 2, 1996

[30] Foreign Application Priority Data

Jul. 4, 1995 [GB] United Kingdom ............... 9513545

[51] Int. Cl.⁶ .................................................. A61B 5/055
[52] U.S. Cl. .......................................... 600/422; 324/318
[58] Field of Search ................ 128/653.2, 653.5; 324/318, 322, 324, 312, 314, 316; 600/410, 421, 420, 422

[56] References Cited

U.S. PATENT DOCUMENTS

| | | | |
|---|---|---|---|
| 4,534,358 | 8/1985 | Young | 128/653 |
| 4,590,947 | 5/1986 | Krause | 128/653 |
| 4,739,269 | 4/1988 | Kopp | 324/318 |
| 4,932,411 | 6/1990 | Fritschy et al. | |
| 5,303,707 | 4/1994 | Young | |
| 5,329,232 | 7/1994 | Gilderdale | 324/318 |
| 5,329,233 | 7/1994 | Hayes | |
| 5,370,118 | 12/1994 | Vij et al. | 128/653.5 |
| 5,389,880 | 2/1995 | Mori | |
| 5,500,595 | 3/1996 | Burton | 324/318 |
| 5,666,055 | 9/1997 | Jones et al. | 324/318 |

FOREIGN PATENT DOCUMENTS

| | | |
|---|---|---|
| 4320531 | 12/1994 | Germany . |
| WO 8905115 | 6/1989 | WIPO . |

OTHER PUBLICATIONS

"Performance of Small Internal Coils for MRI"; Burl, et al.; Proceedings of the Society of Magnetic Resonance in Medicine, Twelfth Annual Scientific Meeting, Aug. 14–20, 1993, New York, vol. 3, p. 1337.

"Improved Dual–Tuned Surface Coil Geometry for Subcutaneously Implanted Tumors For Proton Decoupled $^{31}$p Spectroscopy"; Kim, et al.; Proceedings of the Society of Magnetic Resonance in Medicine, Twelfth Annual Scientific Meeting, Aug. 14–20, 1993, New York, vol. 3, p. 1329.

*Primary Examiner*—Marvin M. Lateef
*Assistant Examiner*—Eleni Mantis Mercader
*Attorney, Agent, or Firm*—Timothy B. Gurin; John J. Fry; Eugene E. Clair

[57] ABSTRACT

A method and coil arrangement for use in magnetic resonance imaging facilitates the examination of a localized region of the body. A plurality of substantially identical saddle coils are disposed about a former. The coils, which define a generally cylindrical volume, overlap one another in a circumferential direction. In one embodiment, a generally planar rectangular coil intersects the cylindrical volume. The method and coil arrangement are particularly well suited to imaging a region adjacent but outside the cylindrical volume. The coil arrangement is also well suited to insertion within the body, especially the rectum.

14 Claims, 2 Drawing Sheets

MAGNETIC RESONANCE METHODS AND APPARATUS

This invention relates to magnetic resonance methods and apparatus.

More particularly the invention relates to such methods and apparatus suitable for examining internal organs of a patient for medical diagnostic purposes.

In magnetic resonance methods and apparatus a static magnetic field is applied to the body under investigation to define an equilibrium axis of magnetic alignment in the region of the body being examined. A radio frequency field is then applied to the region being examined in a direction orthogonal to the static magnetic field direction, to excite magnetic resonance in the region, and resulting r.f. signals are detected and processed.

The exciting r.f. field is applied and resulting signals are detected by r.f. coils placed adjacent the body. Normally separate coils are used for excitation and detection although the same coil or coils may be used for both purposes.

For the examination of a specific small region, e.g. a particular organ of a patient, for medical diagnostic purposes, small r.f. receiving coils positioned as closely as possible to the region of interest are often used. Generally flat, so-called surface coil arrangements placed externally of the patient adjacent the region of interest are commonly used for such examinations. To optimise signal-to-noise performance such surface coil arrangements may comprise a number of coils, adjacent ones of which overlap, as described in United States patent specification No. 4,825,162.

It is an object of the present invention to provide magnetic resonance methods and apparatus suitable for examining internal regions of patients that are difficult to examine using external, surface coil arrangements.

According to one aspect of the invention there is provided a method of examining a region of a body using a magnetic resonance technique comprising: disposing the body in a magnetic field so as to define an equilibrium axis of magnetic alignment in said region; positioning adjacent said region a coil arrangement of generally tubular form with said region lying alongside but outside the cylindrical volume embraced by the coil arrangement; and utilising said coil arrangement to excite and/or detect magnetic resonance in said region.

In such a method the coil arrangement suitably comprises a plurality of saddle coils arranged around said cylindrical volume with adjacent coils partially overlapping one another in a circumferential direction of the volume.

According to a second aspect of the invention there is provided a first particular coil arrangement suitable for use in a method according to the invention comprising: a pair of substantially identical saddle coils which are disposed at complementary positions around a generally cylindrical volume and have a span such that they overlap one another in a circumferential direction at opposite sides of said volume; and a generally planar rectangular third coil which lies in a plane which intersects said volume and is generally parallel to the overlapping portions of the saddle coils. Preferably the third coil lies substantially in a plane containing the main axis of said volume. Preferably the third coil has a cross-sectional area corresponding to the axial cross-sectional area of said volume.

According to a third aspect of the invention there is provided a second particular coil arrangement for use in a method according to the invention comprising three substantially identical saddle coils which are disposed at equally angularly spaced positions around a generally cylindrical volume and have a span such that each coil partially overlaps the other two coils in a circumferential direction.

A magnetic resonance method and apparatus in accordance with the invention will now be described by way of example with reference to the accompanying drawings in which.

Figure 1:
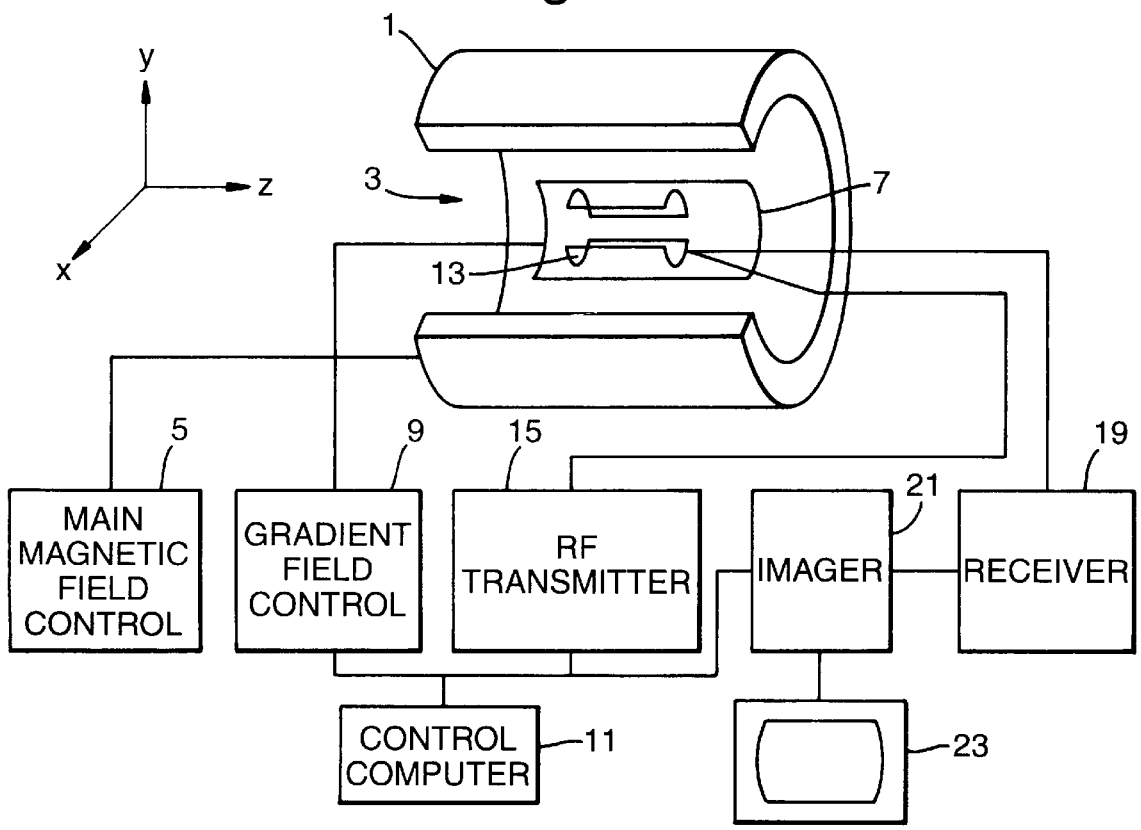
FIG. 1 is a schematic diagram of a typical magnetic resonance apparatus.

Referring to FIG. 1, the apparatus, which is a magnetic resonance medical imaging apparatus, includes a tubular electromagnet 1 which produces a strong uniform static main axial magnetic field in a cylindrical volume 3 in which a patient to be imaged is placed in use of the apparatus.

The strength of the field in the volume 3, and hence in the body of the patient being imaged, is controlled by a main magnet field control means 5 which controls the supply of energising current to the electromagnet energising coil (not shown).

The apparatus further includes a gradient coil arrangement 7 whereby a gradient may be imposed on the static magnetic field in the volume 3 in any one or more of three orthogonal directions. The coil arrangement 7 is energised by a gradient field control means 9 under control of a computer 11.

The apparatus further includes an r.f. coil system 13 which includes a transmitting coil arrangement which in operation of the apparatus is energised by an r.f. transmitter 15 under control of the computer 11 to apply an r.f. field to the body being imaged.

The r.f. coil system 13 also includes an r.f. receiving coil arrangement arranged to detect r.f. signals resulting from magnetic resonance excited in the body of the patient being imaged. The detected signals are passed via a receiver 19 to an imager 21 which under control of the computer 11 processes the signals to produce signals representing an image of the patients body. These signals are, in turn, passed to a display device 23 to provide a visual display of the image.

In operation of the apparatus the strong magnetic field provided by the electromagnet 1 defines an equilibrium axis of magnetic alignment in the body being imaged.

To obtain an image of a selected region, e.g. a cross-sectional slice of the body, an r.f. field pulse is first applied to the body by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction i.e. into the x-y plane with x, y and z directions as depicted in FIG. 1. To restrict excitation to the selected region the r.f. field pulse is applied in conjunction with magnetic field gradients imposed by the coil arrangement 7, the frequency of the r.f.

field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. coil system 13, and processed to produce an image.

Normally a number of excitation and signal detection sequences are required to collect sufficient data to produce a satisfactory image.

Figure 2:
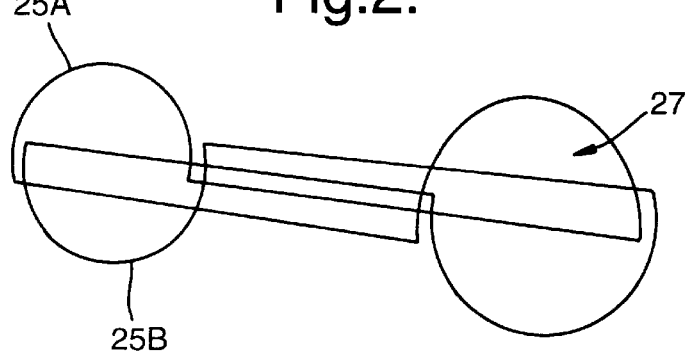
FIG. 2 is a diagrammatic perspective view of a first r.f. coil arrangement suitable for use in a magnetic resonance apparatus for carrying out a method according to the invention.

For examination of a specific small internal region of a patient's body using a method in accordance with the invention a coil arrangement as shown in FIG. 2 may be used.

The arrangement comprises two rectangular, substantially identical, partcircular saddle coils 25A and 25B disposed diametrically opposite one another, in register, around a cylindrical volume 27. Each coil subtends an angle at the axis of the volume 27 which is somewhat greater than 180° by a predetermined amount as further explained below. Hence the two coils 25A, 25B overlap one another along their straight sides. Typically, each coil comprises a single turn, made of copper foil, but may comprise more than one turn. A separate lead (not shown) may be provided for each coil or alternatively the coils may be interconnected, e.g. in parallel or series, and a single lead for the two coils provided. The coils are supported on a suitable former of a biologically inert plastics material which may be of tubular or solid cylindrical form Preferably the coils are embedded within the material of the former rather than mounted on the surface of the former.

The overlap of the two coils 25A, 25B serves to improve the signal to noise ratio of the coil in known manner. To this end the degree of overlap is chosen so as to minimise the mutual coupling of the coils 25A, 25B and thereby minimise noise correlation.

In use, the coil arrangement is placed as close as possible to the small region it is desired to examine, with the region lying alongside the curved surface of the arrangement, but outside the cylindrical volume 27. It will be appreciated the mode of use is thus quite different from that employed when using saddle coil r.f. receiving coil arrangements for whole-body imaging. In a typical application the coil arrangement is placed in a patient's rectum for examining the adjacent regions of the patient. In one such arrangement wherein the coils 25A, 25B are supported on the outside of a solid cylindrical former, the former has a diameter of 12 millimeters and the coils 25A, 25B have an axial length of 10 centimeters and overlap by about 20%, i.e. each coil subtends an angle of about 225° at the axis of the former.

Figure 3:
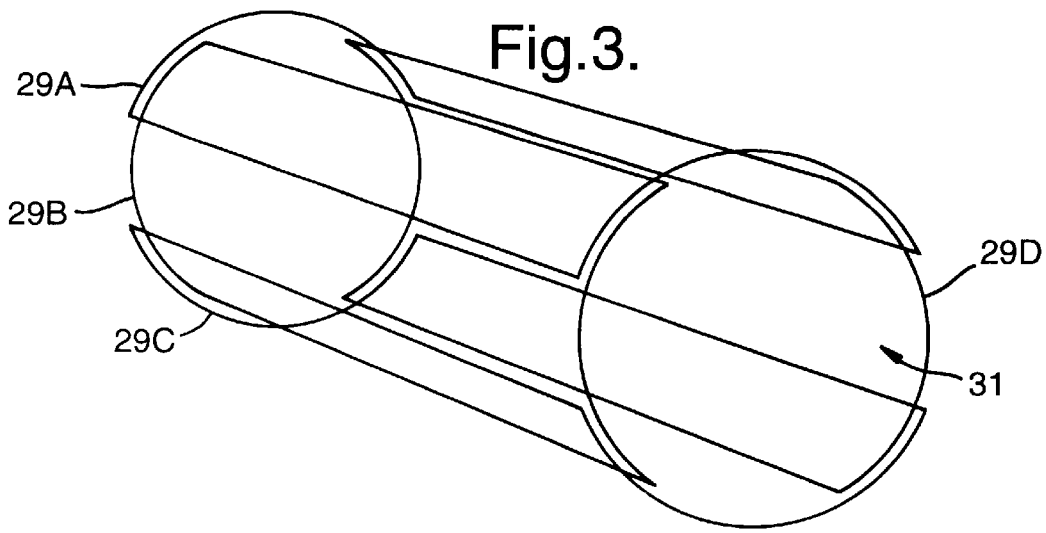
FIG. 3 is a diagrammatic perspective view of a second r.f. coil arrangement suitable for use in a magnetic resonance apparatus for carrying a method according to the invention.

An alternative coil arrangement to that illustrated in FIG. 2 which may be used in a method according to the invention is shown in FIG. 3. This arrangement comprises four, substantially identical, rectangular, part circular, saddle coils 29A, B, C and D positioned symmetrically around a cylindrical volume 31, the lead or leads and former of the arrangement being omitted, for clarity, as in FIG. 2. The diametrically opposite coil pairs 29A, C and 29B, D are disposed in register and each coil subtends an angle somewhat greater than 90° at the axis of the volume 31 so that adjacent pairs of the coils overlap one another along their straight sides, hereby improving signal to noise ratio, as described above in relation to the coil arrangement of FIG. 2. However the strong mutual coupling between the diametrically opposite coil pairs militates against good signal to noise performance with this arrangement.

It will of course be appreciated that the coil arrangement of FIG. 3, when used in a method according to the invention, is placed alongside the region to be examined, not coaxially around the region as is the case when such an arrangement is used for whole-body imaging.

Figure 4:
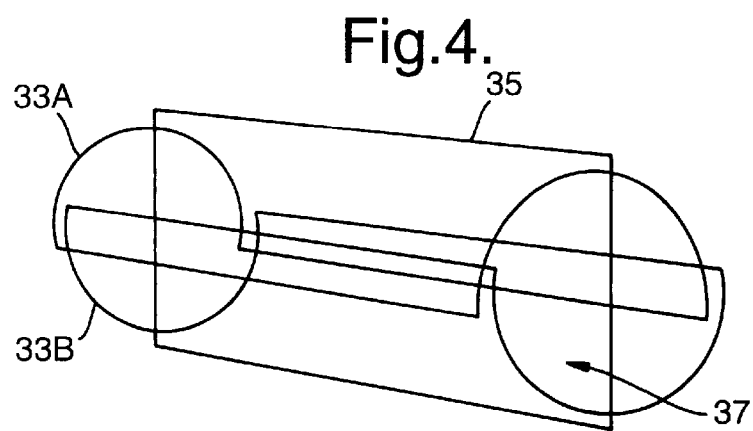
FIG. 4 is a diagrammatic perspective view of a first r.f coil arrangement in accordance with the invention suitable for use in a method according to the invention.

In accordance with the invention there are provided two coil arrangements which are of novel form and are especially suitable for use in the method of the present invention. The first such arrangement, illustrated in FIG. 4, comprises two saddle coils 33A, B shaped and positioned in like manner to the coils 25A, 25B of the coil arrangement of FIG. 2. However, the FIG. 4 arrangement further includes a plane rectangular coil 35 which is disposed generally in a plane which diametrically bisects the cylindrical volume 37 around which the coils 33A, B are disposed, and is generally parallel to the parts of the coils 33A, B which overlap. Normally the coil 37 will have a cross sectional area corresponding to that of the volume 37. By virtue of the orthogonal position of the coil 35 with respect to coils 33A, B, there is low correlation between the noise picked up by the coil 35 and by coils 33A, B, which results in improved signal to noise ratio when the signals picked up by the coils 33A, B and 35 are appropriately combined.

Figure 5:
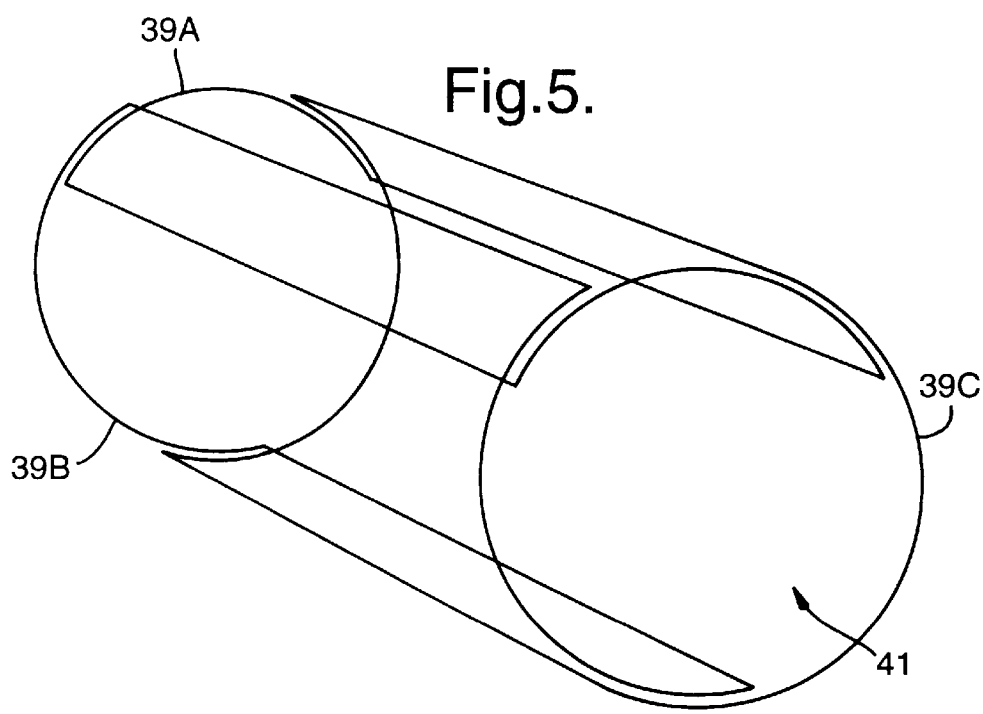
FIG. 5 is a diagrammatic perspective view of a second r.f. coil arrangement in accordance with the invention suitable for use in a method according to the invention.

A second coil arrangement provided by the invention which is especially suitable for use in a method according to the invention, shown in FIG. 5, comprises three substantially identical, rectangular, part-circular, saddle coils 39A, B, C positioned symmetrically around a cylindrical volume 41, the lead(s) and coil former being again omitted for clarity. Each coil subtends an angle of somewhat more than 120° at the axis of the volume 41 so that adjacent pairs of the coils overlap one another along their straight sides. The arrangement operates in similar manner to the arrangement of FIG. 3, but avoids the problem of coupling of diametrically opposite coil pairs which arises with the arrangement of FIG. 3.

In general a coil arrangement according to the invention is found to operate most efficiently when it is positioned with its axis parallel to the direction of the applied magnetic field. However satisfactory results can be obtained with other orientations to the magnetic field.

It will be appreciated that the different signals produced by the coils of a coil arrangement according to the invention may be used to produce different images and the different images combined to form a composite image. Alternatively, the signals may be combined and the combined signals used to produce a single image.

It should be understood that whilst in the arrangements described above, by way of example, the coils and the cylindrical volumes they surround are part-circular and circular cylindrical, this is not necessarily the case in methods and coil arrangements according to the invention. Hence in other methods and coil arrangements the cylindrical volumes and coil arrangement may be non circular e.g. oval or even substantially rectangular in section.

It should further be understood that whilst a coil arrangement according to the invention finds particular application as an r.f. receiving coil arrangement it may also be employed as an r.f. transmitting coil.

What is claimed is:

1. A method of examining a region of a body using a magnetic resonance technique comprising: disposing the body in a magnetic field so as to define an equilibrium axis of magnetic alignment in said region; positioning adjacent said region a coil arrangement of generally tubular form with said region lying alongside the curved surface of the coil arrangement but outside the cylindrical volume embraced by the coil arrangement; and utilizing said coil arrangement for at least one of exciting and detecting magnetic resonance in said region, the coil arrangement comprising a plurality of saddle coils arranged around said cylindrical volume with adjacent saddle coils partially overlapping one another in a circumferential direction of the volume.

2. A method according to claim 1 wherein the coil arrangement comprises two saddle coils disposed opposite each other around the cylindrical volume.

3. A method of examining a region of a body using a magnetic resonance technique comprising: disposing the body in a magnetic field so as to define an equilibrium axis of magnetic alignment in said region; positioning adjacent said region a coil arrangement of generally tubular form with said region lying alongside but outside the cylindrical volume embraced by the coil arrangement; and utilizing said coil arrangement for at least one of exciting and detecting magnetic resonance in said region, the coil arrangement comprising a plurality of saddle coils arranged around said cylindrical volume with adjacent saddle coils partially overlapping one another in a circumferential direction of the volume wherein the coil arrangement further comprises a coil which bisects the cylindrical volume.

4. A method of examining a region of a body using a magnetic resonance technique comprising: disposing the body in a magnetic field so as to define an equilibrium axis of magnetic alignment in said region; positioning adjacent said region a coil arrangement of generally tubular form with said region lying alongside the curved surface of the coil arrangement but outside the cylindrical volume embraced by the coil arrangement, and utilizing said coil arrangement for at least one of exciting and detecting magnetic resonance in said region, the coil arrangement comprising at least three saddle coils disposed around the cylindrical volume.

5. A method according to claim 4 wherein at least three coils are disposed at equally angularly spaced positions around the volume and have a span such that each coil partially overlaps its adjacent coils in a circumferential direction.

6. A coil arrangement suitable for examining a region of a body using a magnetic resonance technique, the coil arrangement comprising: a pair of substantially identical saddle coils which are disposed at complementary positions around a generally cylindrical volume and have a span such that they overlap one another in a circumferential direction at opposite sides of said volume; and a generally planar rectangular third coil which lies in a plane which intersects said volume and is generally parallel to the overlapping portions of the saddle coils, wherein the coil arrangement is suitable for at least one of detecting and exciting magnetic resonance in a region outside the cylindrical volume.

7. A coil arrangement according to claim 6 wherein the third coil lies substantially in a plane which contains the main axis of said volume.

8. A coil arrangement according to claim 6 wherein the third coil has a cross-sectional area corresponding to the axial cross-sectional area of said volume.

9. The coil arrangement of claim 6 having dimensions suitable for insertion into the rectum for examining adjacent regions of the body.

10. A coil arrangement suitable for examining a region of the body using a magnetic resonance technique, the coil arrangement comprising three substantially identical saddle coils which are disposed at equally angularly spaced positions around a cylindrical volume and have a span such that each coil partially overlaps the other two coils in a circumferential direction, wherein the coil arrangement is suitable for at least one of detecting and exciting magnetic resonance in a region lying alongside the curved surface of the coil arrangement but outside the cylindrical volume embraced by the coil arrangement.

11. The coil arrangement of claim 10 having dimensions suitable for insertion into the rectum for examining adjacent regions of the body.

12. The coil arrangement of claim 10 wherein each coil comprises a single turn.

13. The coil arrangement of claim 10 further comprising a former, the coils being embedded therein.

14. The coil arrangement of claim 10 wherein the coils are interconnected.

* * * * *